(12) United States Patent
Gao et al.

(10) Patent No.: US 8,778,797 B2
(45) Date of Patent: Jul. 15, 2014

(54) SYSTEMS AND METHODS FOR SELECTIVE TUNGSTEN DEPOSITION IN VIAS

(75) Inventors: Juwen Gao, San Jose, CA (US); Rajkumar Jakkaraju, Sunnyvale, CA (US); Michal Danek, Cupertino, CA (US); Wei Lei, Santa Clara, CA (US)

(73) Assignee: Novellus Systems, Inc., San Jose, CA (US)

( * ) Notice: Subject to any disclaimer, the term of this patent is extended or adjusted under 35 U.S.C. 154(b) by 130 days.

(21) Appl. No.: 13/242,160

(22) Filed: Sep. 23, 2011

(65) Prior Publication Data

US 2012/0077342 A1    Mar. 29, 2012

Related U.S. Application Data

(60) Provisional application No. 61/386,791, filed on Sep. 27, 2010.

(51) Int. Cl.
*H01L 21/44*    (2006.01)

(52) U.S. Cl.
USPC ........... 438/656; 438/675; 438/677; 438/680; 438/685

(58) Field of Classification Search
USPC ......................... 438/656, 675, 677, 680, 685
See application file for complete search history.

(56) References Cited

U.S. PATENT DOCUMENTS

| 5,260,232 | A | * | 11/1993 | Muroyama et al. ............ 438/672 |
| 5,966,607 | A | * | 10/1999 | Chee et al. .................... 438/305 |
| 6,645,847 | B2 | | 11/2003 | Paranjpe et al. |
| 7,005,372 | B2 | | 2/2006 | Levy et al. |
| 7,589,017 | B2 | | 9/2009 | Chan et al. |
| 2006/0009034 | A1 | | 1/2006 | Lai et al. |
| 2008/0042291 | A1 | * | 2/2008 | Knarr et al. ................... 257/762 |
| 2009/0053893 | A1 | * | 2/2009 | Khandelwal et al. ......... 438/680 |
| 2010/0159694 | A1 | | 6/2010 | Chandrashekar et al. |

OTHER PUBLICATIONS

International Search Report and Written Opinion for International Application No. PCT/US2011/053203 filed Sep. 26, 2011; 6 pages.

* cited by examiner

*Primary Examiner* — Zandra Smith
*Assistant Examiner* — Jamie C Niesz

(57) ABSTRACT

A method for processing a substrate includes providing a substrate including a metal layer, a dielectric layer arranged on the metal layer, and at least one of a via and a trench formed in the dielectric layer; depositing a metal using chemical vapor deposition (CVD) during a first deposition period, wherein the first deposition period is longer than a first nucleation period that is required to deposit the metal on the metal layer; stopping the first deposition period prior to a second nucleation delay period, wherein the second nucleation period is required to deposit the metal on the dielectric layer; performing the depositing and the stopping N times, where N is an integer greater than or equal to one; and after the performing, depositing the metal using CVD during a second deposition period that is longer than the second nucleation delay period.

18 Claims, 13 Drawing Sheets

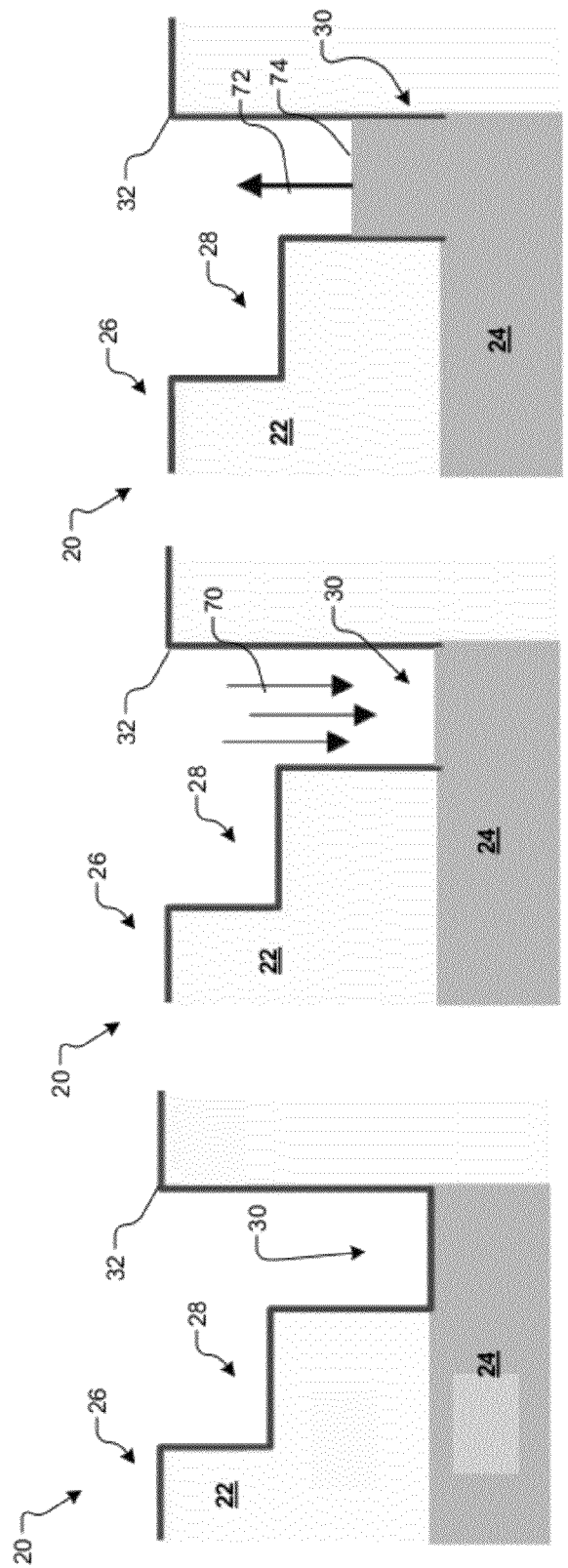

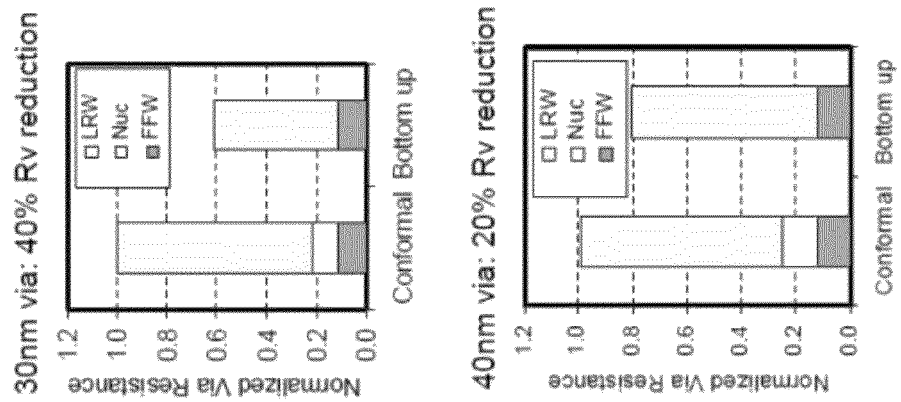
FIG. 5
FIG. 6
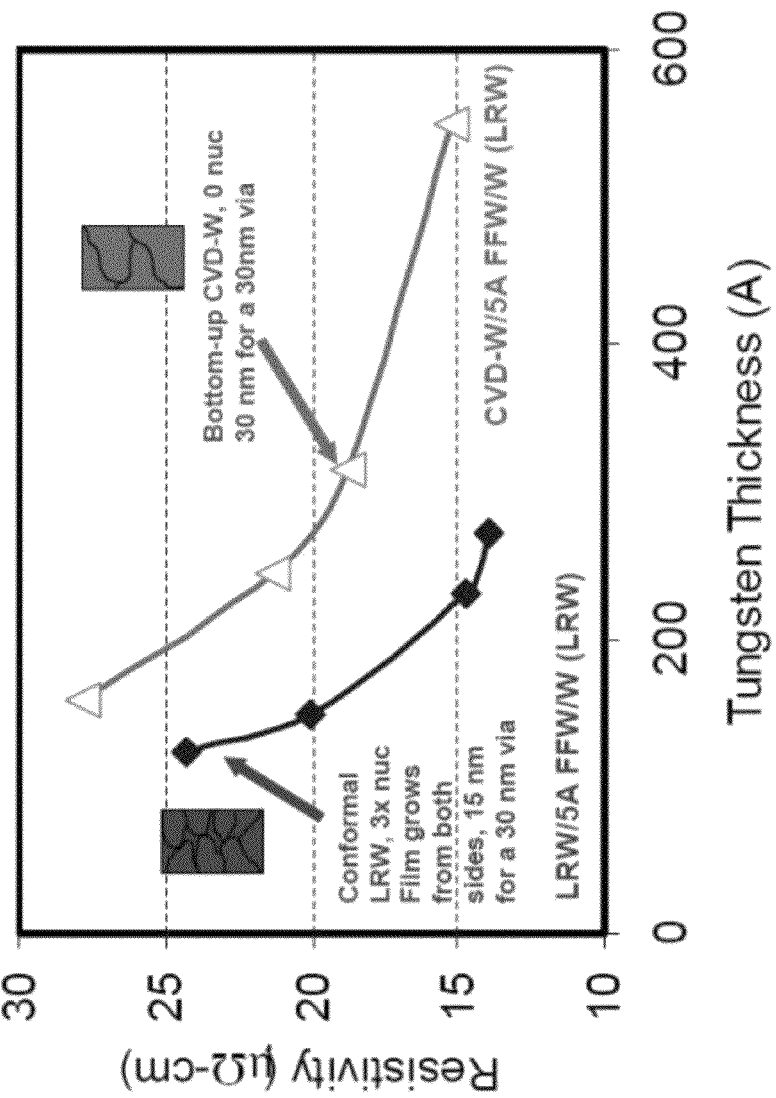
FIG. 4

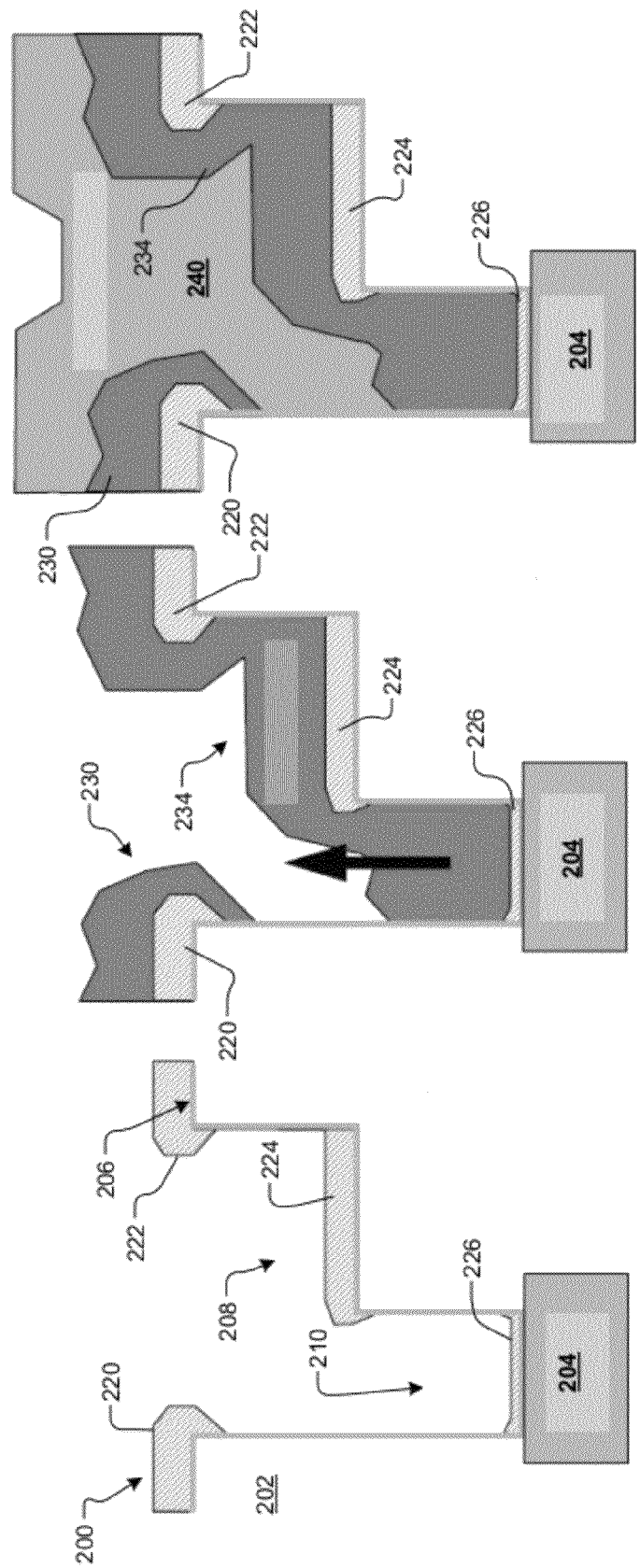

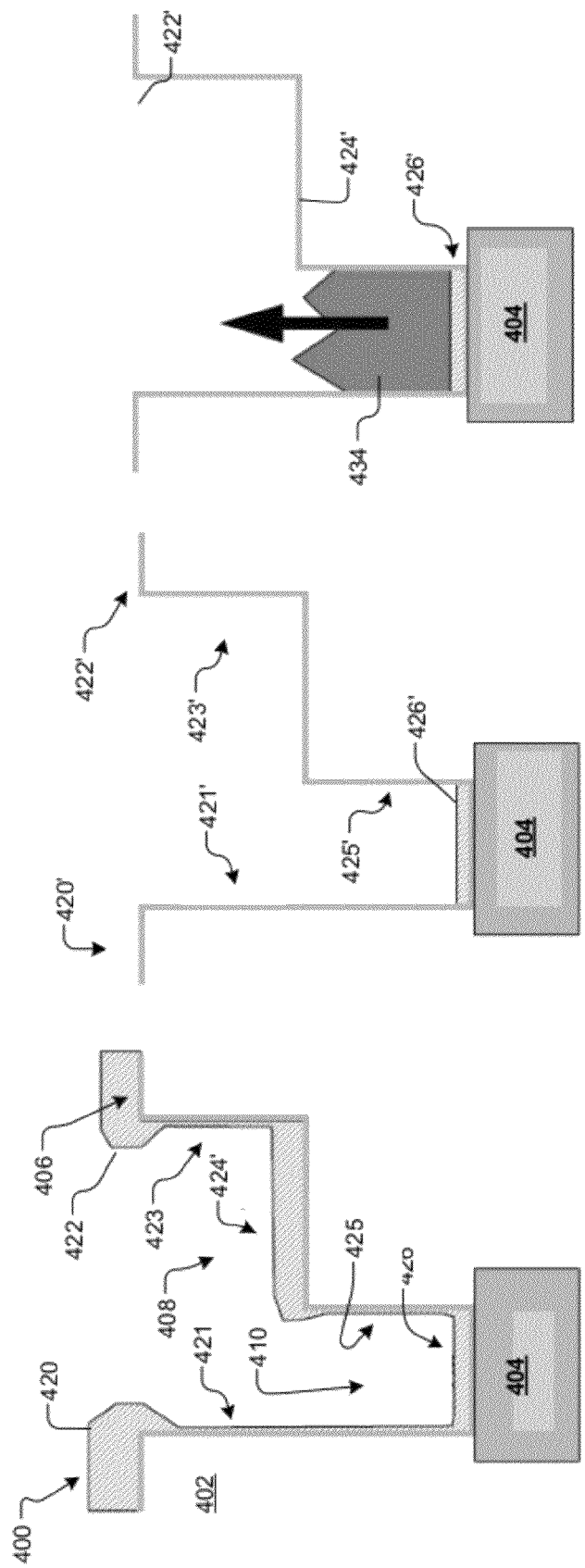

SYSTEMS AND METHODS FOR SELECTIVE TUNGSTEN DEPOSITION IN VIAS

CROSS-REFERENCE TO RELATED APPLICATIONS

This application claims the benefit of U.S. Provisional application Ser. No. 61/386,791, filed on Sep. 27, 2010. The entire disclosure of the above application is incorporated herein by reference.

FIELD

The present disclosure relates to systems and methods for filling a via from bottom up using selective tungsten deposition.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Semiconductor substrates often include features such as vias that are filled with a conductive material to allow interconnection of conductive layers. For example, some substrates may include an interlayer dielectric (ILD) arranged on a tungsten layer. A via may be defined in the ILD to allow connection to the tungsten layer. The via needs to be filled with a conductive material such as tungsten to allow connection to the tungsten layer. Usually, it is important for the connection to have low resistance to minimize power dissipation and heat.

A conformal fill approach may be used to fill the via. This approach grows tungsten film from both side walls of the via. As a dimension between the side walls shrinks, the tungsten grain growth is limited. As a result, the resistivity of the film is limited. Also, a seam can be created in a center of the via. The seam limits the volume filled with tungsten and compromises via resistance.

SUMMARY

This section provides a general summary of the disclosure, and is not a comprehensive disclosure of its full scope or all of its features.

A method for processing a substrate includes providing a substrate including a metal layer, a dielectric layer arranged on the metal layer, and at least one of a via and a trench formed in the dielectric layer; depositing metal using chemical vapor deposition (CVD) during a first deposition period, wherein the first deposition period is longer than a first nucleation period that is required to deposit the metal on the metal layer; stopping the first deposition period prior to a second nucleation delay period, wherein the second nucleation period is required to deposit the metal on the dielectric layer; performing the depositing and the stopping N times, where N is an integer greater than or equal to one; and after the performing, depositing the metal using CVD during a second deposition period that is longer than the second nucleation delay period.

In other features, the metal comprises tungsten. The metal layer comprises tungsten. The method includes depositing a nucleation layer prior to the first deposition period. The nucleation layer comprises one of fluorine-free tungsten layer and a tungsten/tungsten-nitride layer. The nucleation layer has a thickness between 2 Angstroms and 30 Angstroms.

In other features, the method includes performing a growth interruption treatment to interrupt growth of the metal on the dielectric layer after the stopping and before at least one of another one of the N times and the second deposition period. The growth interruption treatment comprises performing an ammonia soak during a soak period. Alternately, the growth interruption treatment comprises performing a flourine soak during a soak period.

In other features, the method includes depositing a nucleation layer prior to the first deposition period. The method includes performing a sputter etch process prior to the first deposition period to at least partially remove the nucleation layer in the via at a contact bottom.

A method for processing a substrate includes providing a substrate including a metal layer, a dielectric layer arranged on the metal layer, and at least one of a via and a trench formed in the dielectric layer; depositing metal using physical vapor deposition (PVD); depositing the metal using chemical vapor deposition (CVD) during a second deposition period, wherein the second deposition period is longer than a first nucleation period required to deposit the metal on the metal layer; stopping the second deposition period prior to a second nucleation delay period, wherein the second nucleation delay period is required to deposit the metal on the dielectric layer; performing the CVD depositing and the stopping N times, where N is an integer greater than or equal to one; and after the performing, depositing the metal using CVD during a third deposition period that is longer than the second nucleation delay period.

In other features, the metal comprises tungsten. The metal layer comprises tungsten. The method includes depositing a nucleation layer prior to the first deposition period. The nucleation layer comprises one of fluorine-free tungsten layer and a tungsten/tungsten-nitride layer. The nucleation layer has a thickness between 2 Angstroms and 30 Angstroms.

In other features, the method includes performing a growth interruption treatment to interrupt growth of the metal on the dielectric layer after the stopping and before at least one of another one of the N times and the third deposition period. The growth interruption treatment comprises performing an ammonia soak for a soak period. Alternately, the growth interruption treatment comprises performing a flourine soak for a soak period.

In other features, the PVD comprises directional PVD. Alternately, the PVD comprises non-directional PVD. The method includes depositing a nucleation layer prior to the first deposition period. The method includes performing a sputter etch process to etch the metal from sidewalls of the via prior to the second deposition period and the third deposition period. The method includes depositing a nucleation layer prior to the first deposition period. The method includes performing a sputter etch process to etch the metal from a field of the substrate, the trench and sidewalls of the via prior to the second deposition period and the third deposition period.

Further areas of applicability will become apparent from the description provided herein. The description and specific examples in this summary are intended for purposes of illustration only and are not intended to limit the scope of the present disclosure.

BRIEF DESCRIPTION OF THE DRAWINGS

The present disclosure will become more fully understood from the detailed description and the accompanying drawings, wherein:

FIGS. 3A-3C are cross-sectional views illustrating deposition of tungsten in a via using another fill approach according to the present disclosure;

FIG. 4 illustrates a relationship between resistance and tungsten thickness using conformal and bottom-up fill approaches;

FIGS. 5-6 illustrate normalized via resistance for conformal and bottom-up fill approaches;

FIGS. 9A-9C are cross-sectional views illustrating deposition of tungsten in a via using another fill approach according to the present disclosure;

FIGS. 11A-11C are cross-sectional views illustrating deposition of tungsten in a via using another fill approach according to the present disclosure.

DETAILED DESCRIPTION

Figure 1:
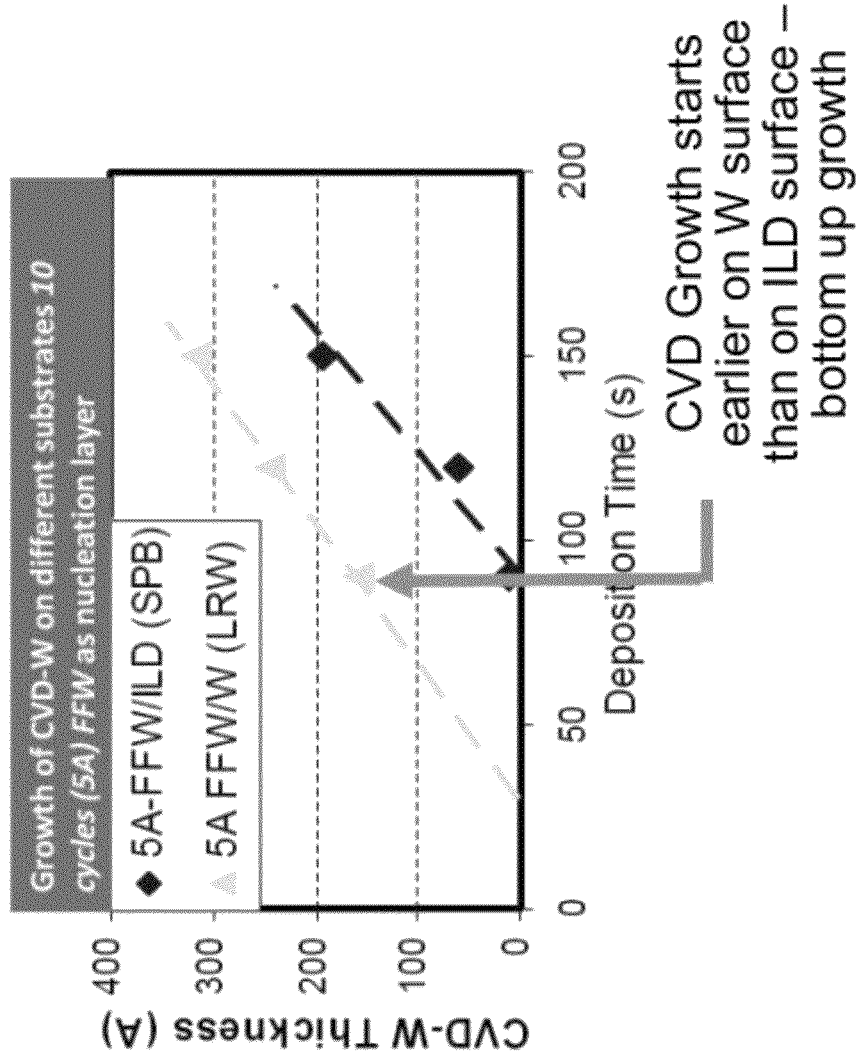
FIG. 1 is a graph illustrating tungsten thickness as a function of deposition time over various underlying materials.

The following description is merely exemplary in nature and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical or. It should be understood that steps within a method may be executed in different order without altering the principles of the present disclosure.

The present disclosure utilizes selective growth of a metal such as but not limited to chemical vapor deposition tungsten (CVD-W) to at least partially fill a via using a bottom-up approach. The selective growth is followed by non-selective growth in the trench and/or field.

The growth of a metal such as but not limited to CVD-W has a different nucleation delay on metal substrates (such as tungsten (W), copper (Cu) and other materials) as compared to interlayer dielectric (ILD). Usually, the nucleation delay on the metal substrate is shorter than on the ILD. The nucleation delay differences can be used to allow selective growth on the metal substrate. The present disclosure utilizes the selectivity to allow tungsten growth from a contact bottom (usually metal) while limiting the growth from the dielectric side walls. Using this approach leads to bottom-up fill of the via and elimination of the seam.

In some implementations, a nucleation layer can be used before the selective CVD-W growth. The nucleation layer may include fluorine-free tungsten (FFW) layer, a low temperature pulsed nucleation layer tungsten-tungsten nitride (PNL)-W/WN layer, or another suitable nucleation layer. The nucleation layer may be sufficiently thin such that it does not compromise the selectivity. For example only, the FFW layer may have a thickness from 2-30 angstroms (Å).

In some implementations requiring additional thickness, a growth interruption treatment can be used to interrupt growth of CVD-W on the ILD. For example only, the growth interruption treatment may include an ammonia ($NH_3$) soak to interrupt the growth on the ILD. Fluorine treatment may also be used. The deposition of tungsten resumes after the growth interruption treatment. This pattern can be repeated until the desired thickness is achieved.

To enhance selectivity and maintain low resistivity, a large $H_2$ to $WF_6$ ratio may be applied during the CVD-W nucleation. This can be achieved either in CVD mode or pulsed nucleation layer (PNL) mode where $H_2$ flows continuously while $WF_6$ pulses. This approach can also be used in a barrier first fashion. Using the approach described herein allows bottom-up fill while maximizing tungsten grain and eliminating seams associated with conformal growth. This approach can be performed on Novellus Altus® DirectFill™ systems (Fluorine-free tungsten, preclean+tungsten nitride (WN), or preclean+PNL) with minimal hardware modifications.

Non-limiting exemplary implementations are set forth below for further illustration. Referring now to FIG. 1, tungsten (W) thickness is shown as a function of deposition time over various underlying materials. As can be seen, tungsten growth starts on FFW/W more quickly than on FFW/ILD. In other words, the nucleation delay of CVD-W is longer on FFW/ILD as compared to FFW/W. The present disclosure describes systems and methods that take advantage of the nucleation delay to selectively grow CVD tungsten and allow bottom up fill of vias. As can be seen, the selective growth approach described herein allows approximately 150 angstroms (Å) of tungsten growth on FFW/W before tungsten growth begins on the FFW/ILD.

In some implementations, the CVD-W growth is started and continued for a predetermined selectivity period that is less than a predetermined period that would allow FFW/ILD growth. Then, CVD-W growth is terminated and the growth interruption treatment is performed to interrupt growth on FFW/ILD. CVD-W growth is then initiated again on FFW/W and continued for a period of less than or equal to the predetermined selectivity period. CVD-W growth can then proceed to non-selective growth. In some implementations, non-selective growth refers to CVD-W growth for periods longer than the predetermined selectivity period (without interruption), although other non-selective growth approaches may be used. Alternatively, growth can be interrupted again using the growth interruption treatment. The pattern can be repeated until a desired thickness is achieved.

Figure 2A:
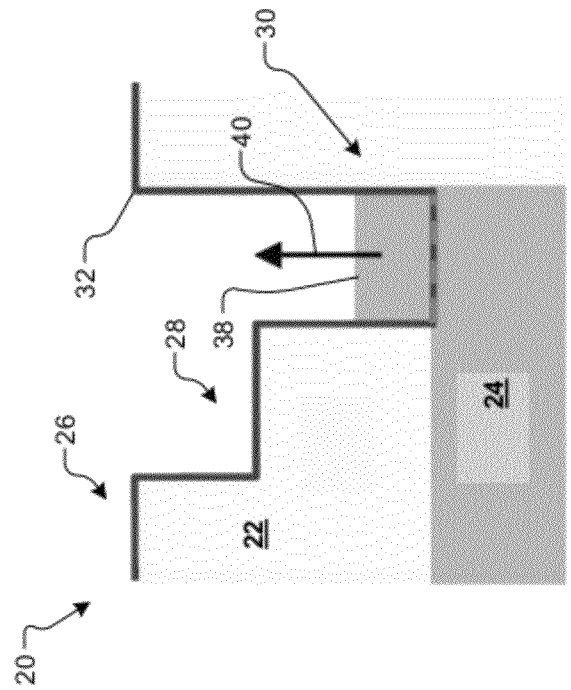
FIGS. 2A-2B are cross-sectional views illustrating deposition of tungsten in a via using one fill approach according to the present disclosure.

Referring now to FIG. 2A, deposition of tungsten in a via using one fill approach according to the present disclosure is shown. A substrate 20 includes a tungsten layer 24. The tungsten layer 24 may comprise low resistivity tungsten (LRW). An interlayer dielectric (ILD) 22 is arranged on the tungsten layer 24 to define a field 26, a trench 28, and/or a via 30. A nucleation layer 32 may be deposited on the field 26, the trench 28 and/or the via 30. For example only, the nucleation layer 32 may comprise fluorine free tungsten (FFW) having a thickness from 2-30 angstroms (Å). For example only, the FFW may have a thickness of 5 Å.

After depositing the nucleation layer 32, CVD-W 38 is deposited in the via 30 using a selective fill approach. In other words, the tungsten is grown using CVD-W and terminated prior to growth on the ILD. A growth interruption treatment may be performed and then the CVD-W growth may be initiated again. One or more CVD-W and growth interruption steps may be used to achieve a desired thickness. When the desired thickness is reached, non-selective CVD-W growth may be initiated. Non-selective CVD-W growth may comprise CVD-W growth for a period longer than the predetermined selectivity periods, although other methods may be used.

Figure 2B:
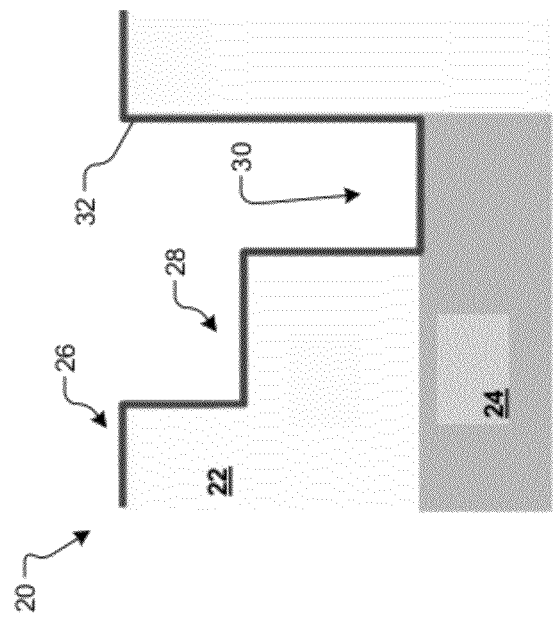
Figure 2C:
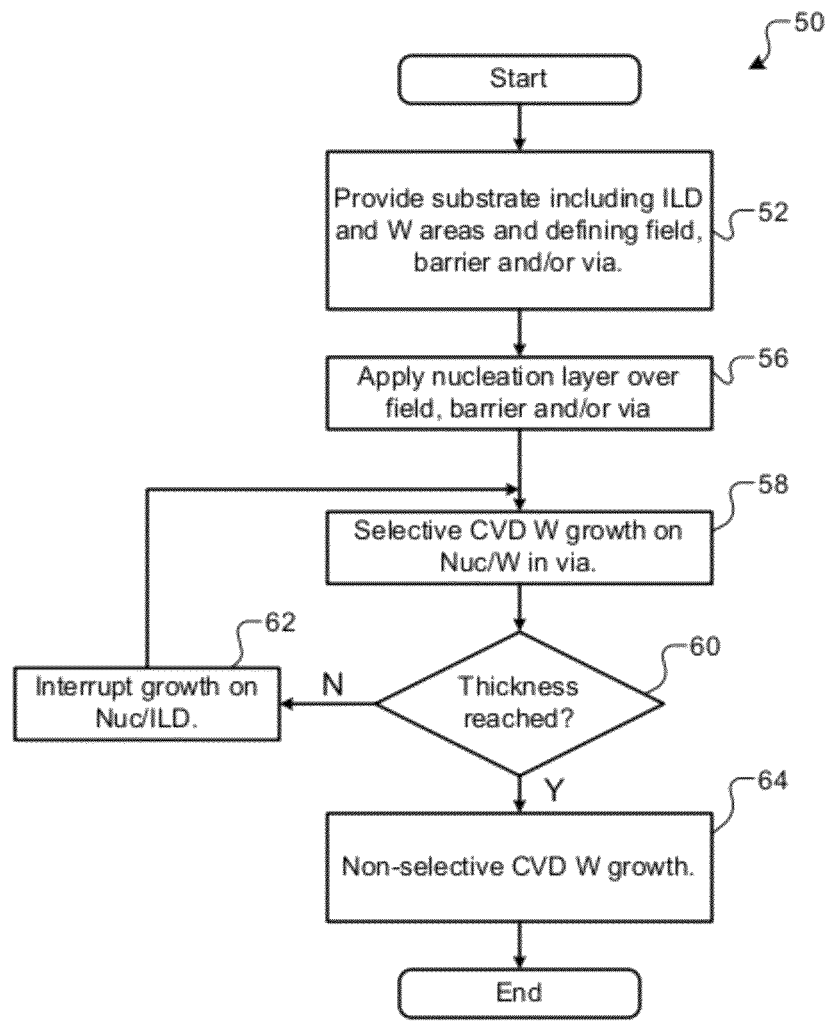
FIG. 2C is a flowchart illustrating a method for depositing tungsten in the via of FIGS. 2A-2B.

Referring now to FIG. 2C, a method 50 for depositing tungsten in the via of FIGS. 2A-2B is shown. A substrate is provided at 52. The substrate includes ILD and tungsten areas that define a field, a trench and/or a via. At 56, the nucleation layer 32 is deposited on the field 26, trench 28 and/or via 30.

At 58, selective CVD-W growth is initiated. At 60, the method determines whether the desired thickness has been reached. If false, the method uses a growth interruption treatment to interrupt growth on FFW/ILD and the method returns to 58. When 60 is true, the method initiates nonselective CVD-W growth at 64. In some implementations, the nonselective CVD-W growth fills the via and trench regions and may extend above the field to create overburden and allow subsequent processing. For example, the subsequent processing may include chemical mechanical polishing (CMP).

Referring now to FIGS. 3A-3C, another approach that is similar to that shown in FIGS. 2A-2C is shown. After depositing the nucleation layer 32, a sputter etch process identified by arrows 70 is used to remove the nucleation layer 32 in the via 30 above the tungsten layer 24. Then, the selective CVD-W growth is performed followed by nonselective CVD-W growth.

Figure 3D:
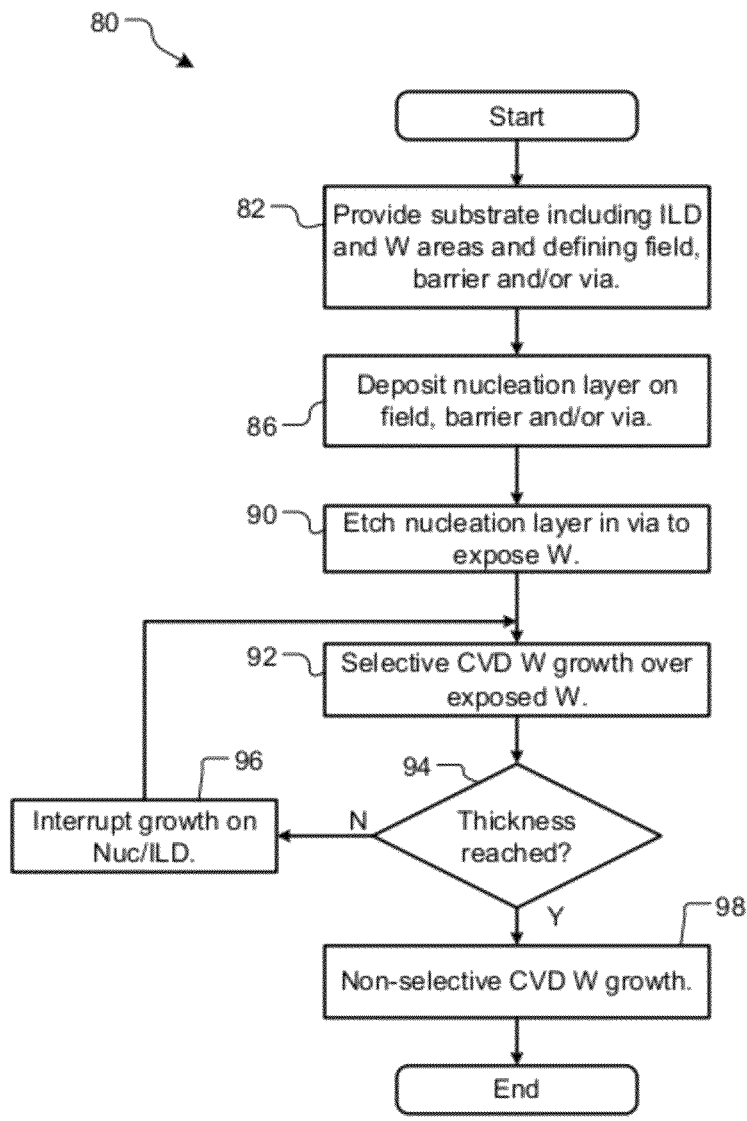
FIG. 3D is a flowchart illustrating a method for depositing tungsten in the via of FIGS. 3A-3C.

Referring now to FIG. 3D, a method 80 for depositing tungsten in the via of FIGS. 3A-3C is shown. A substrate is provided at 82. The substrate includes ILD and tungsten areas that define a field, a trench and/or a via. At 86, the nucleation layer 32 is deposited. At 90, after depositing the nucleation layer 32, the method 80 etches the nucleation layer 32 in the via 30 above the tungsten layer 24. At 92, selective CVD-W growth is performed.

At 94, if the CVD-W in the via 30 does not have sufficient thickness, CVD-W growth is interrupted at 96 using a growth interruption treatment to interrupt growth on FFW/ILD and the method continues at 92. When a sufficient thickness is reached, nonselective CVD-W growth is performed at 98.

Referring now to FIG. 4, relationships between resistance and tungsten thickness using a conformal approach and a bottom-up approach are shown. As can be appreciated, the bottom-up CVD-W approach has an improved grain structure as compared to the conformal approach. For example only, when filling a via (for example a 30 nm via), bottom-up CVD-W grain size can be as big as the feature size (e.g. 30 nm in this example). The conformal approach grains are limited to half of the feature (or 15 nm in this example). Due to the larger grain size to fill the same feature, the bottom-up approach would result in low via resistance.

Referring now to FIGS. 5-6, normalized via resistance for conformal and bottom-up approaches is shown. As can be appreciated, the bottom up approach has a lower normalized via resistance as compared to the conformal approach.

Figure 7:
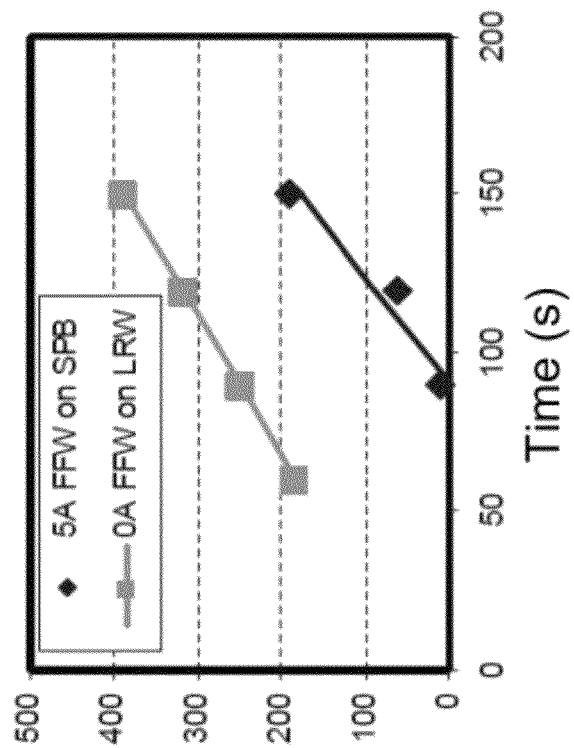
FIG. 7 illustrates deposition thickness as a function of time (or selectivity) both with and without a fluorine free tungsten (FFW) nucleation layer.

Referring now to FIG. 7, deposition thickness as a function of time (or selectivity) with and without the FFW nucleation layer is shown. Additional selectivity is provided when the CVD-W growth is performed directly on the tungsten layer (as shown in FIGS. 3A-3D).

Figure 8:
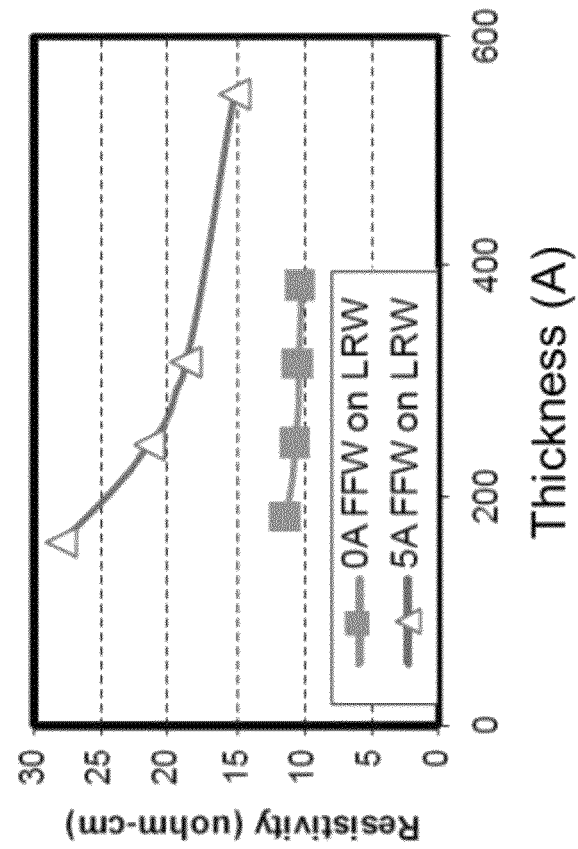
FIG. 8 illustrates resistance as a function of thickness both with and without a fluorine free tungsten (FFW) nucleation layer.

Referring now to FIG. 8, resistance as a function of thickness with and without the FFW nucleation layer is shown. A lower resistance is provided when the CVD-W growth is performed directly on the tungsten layer after etching the FFW nucleation layer (as shown in FIGS. 3A-3D).

Referring now to FIGS. 9A-9C, deposition of tungsten in a via using another fill approach according to the present disclosure is shown. A substrate 200 includes a tungsten layer 204 and an interlayer dielectric (ILD) 202 defining a field 206, a trench 208, and/or a via 210. PVD-W 220 and 222 may be deposited on the field 206 using a directional physical vapor deposition (PVD) approach. Likewise, PVD-W 224 may be deposited on the trench 208 and PVD-W 226 may be deposited in the via 210

After depositing the PVD-W 220, 222, 224 and 226, CVD tungsten 234 is deposited on the PVD-W 220, 222, 224 and 226 using a selective approach. When a sufficient thickness is reached, non-selective CVD-W growth is initiated and may continue until the non-selective CVD-W extends above the field to allow subsequent processing.

For example, the subsequent processing may include chemical mechanical polishing (CMP). For example only, a thickness of the PVD-W 226 in the via 210 may be 50 (Å). A thickness of the PVD-W 224 in the trench may be 100 (Å). A thickness of the PVD-W 220 and 222 may be 200 (Å). Other thicknesses may be used.

Figure 9D:
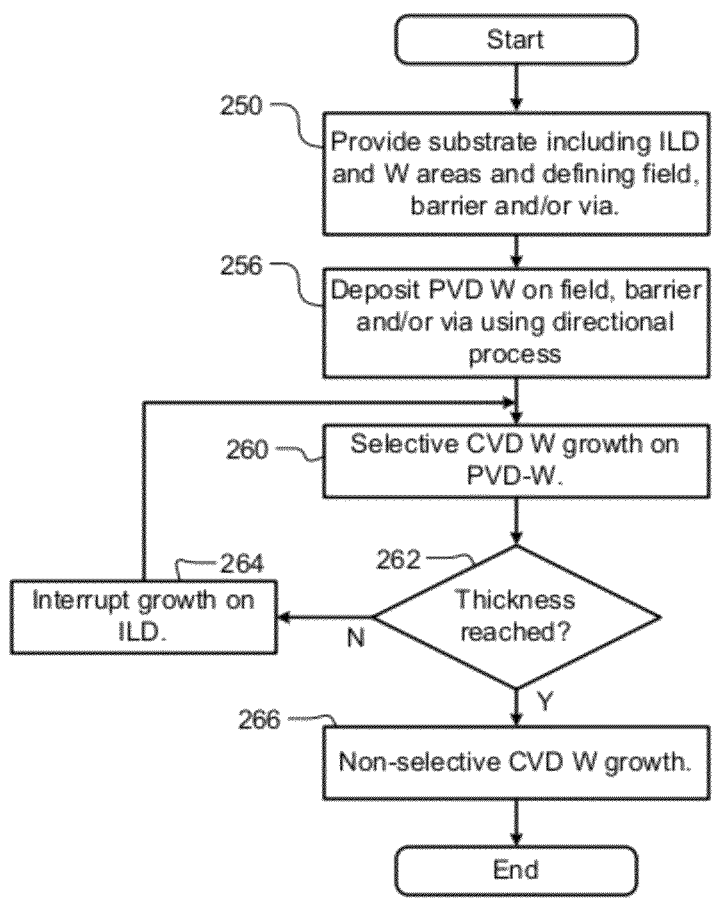
FIG. 9D is a flowchart illustrating a method for depositing tungsten in the via of FIGS. 9A-9C.

Referring now to FIG. 9D, a method 248 for depositing tungsten in the via of FIGS. 9A-9C is shown. A substrate is provided at 250. The substrate includes ILD and tungsten areas that define a field, a trench and/or a via.

At 256, a directional PVD-W process is used to deposit tungsten on the field, trench and/or via. At 260, selective CVD-W growth is initiated on the PVD-W. At 262, the method determines whether the desired thickness has been reached. If false, the method interrupts growth on the ILD at 264 and the method returns to 260. When the desired thickness is reached at 262, the method initiates nonselective CVD-W growth at 266. In some implementations, the non-selective CVD-W growth fills the via and trench regions and may extend above the field to allow subsequent processing. For example, the subsequent processing may include chemical mechanical polishing (CMP).

Figures 10A, 10B, 10C:
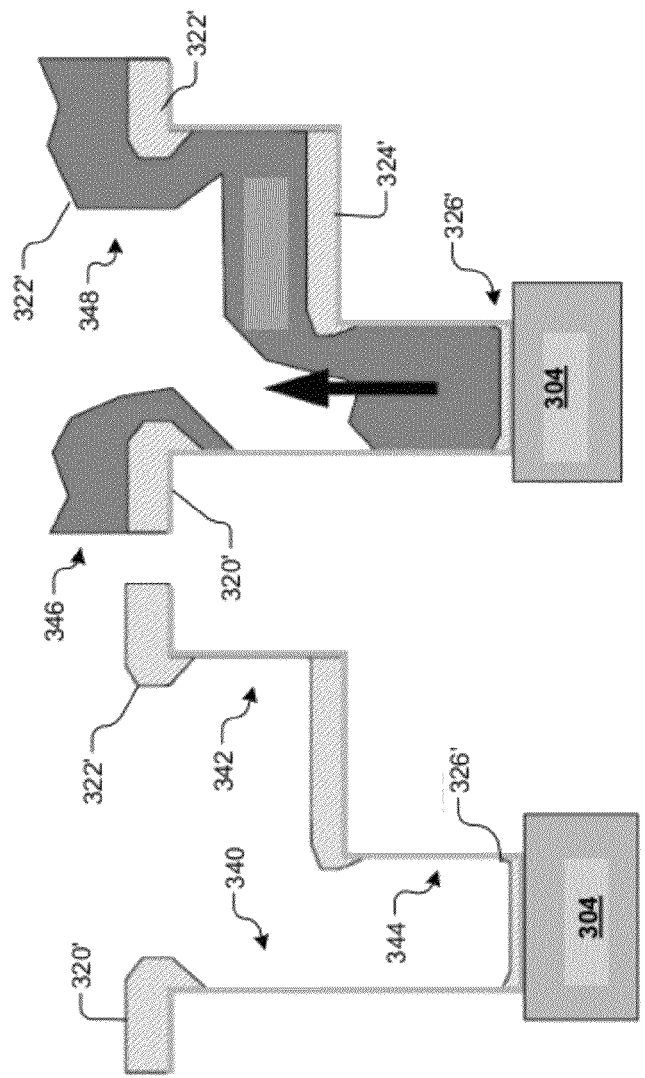
FIGS. 10A-10C are cross-sectional views illustrating deposition of tungsten in a via using another fill approach according to the present disclosure.

Referring now to FIGS. 10A-10C, deposition of tungsten in a via using another fill approach according to the present disclosure is shown. A substrate 300 includes a tungsten layer 304 and an interlayer dielectric (ILD) 302 defining a field 306, a trench 308, and/or a via 310. PVD-W 320 and 322 may be deposited on the field 306 using a non-directional physical vapor deposition (PVD) approach. Likewise, PVD-W 324 may be deposited on the trench 308 and PVD-W 326 may be deposited in the via 310. PVD-W 321, 323 and 325 may be deposited on sidewalls. As can be appreciated, a thickness of the PVD-W layer is thinner on the sidewalls 321, 323 and 325 as compared to the PVD-W 320, 322, 324 and 326 on the field 306, the trench 308, and the via 310. An etchback process may be performed. Since the PVD-W is thinnest on the sidewalls, the PVD-W is eliminated there first.

After the etchback process, tungsten 334 is deposited on the layers 320', 322', 324' and 326' (after etch) using a selective CVD approach. In other words, the tungsten is grown using one or more selective CVD-W growth and growth interruption steps. Then, non-selective CVD-W growth is initiated and may continue until the non-selective CVD-W extends above the field to allow subsequent processing. For example, the subsequent processing may include chemical mechanical polishing (CMP).

Figure 10D:
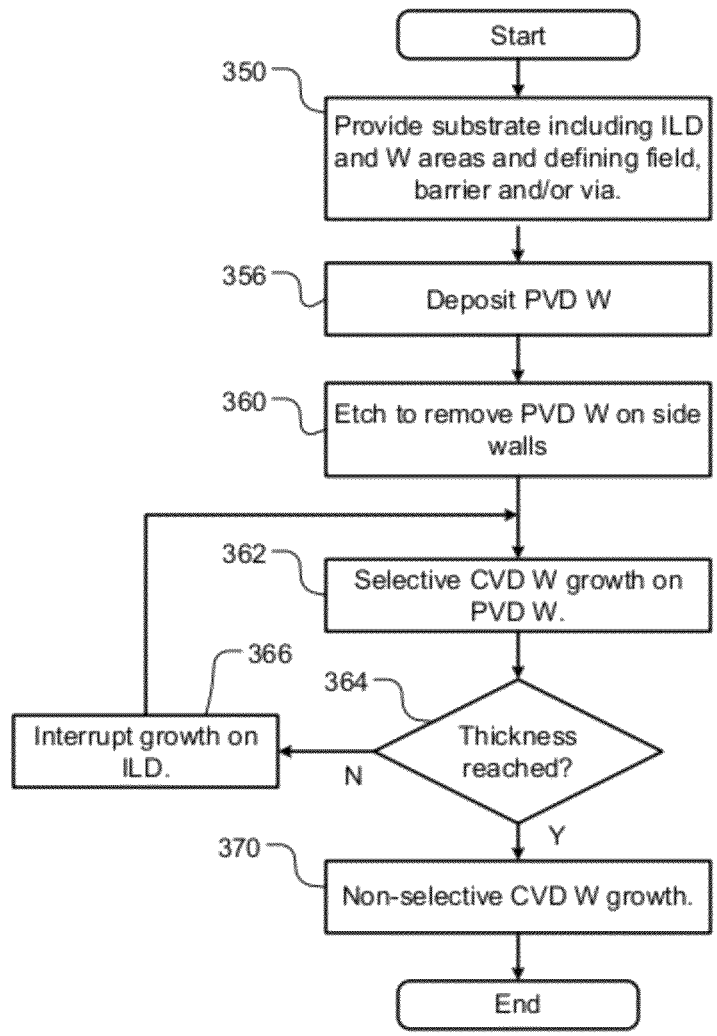
FIG. 10D is a flowchart illustrating a method for depositing tungsten in the via of FIGS. 10A-10C.

Referring now to FIG. 10D, a method 350 for depositing tungsten in the via of FIGS. 10A-10C is shown. At 350, a substrate is provided that includes ILD and tungsten layers that define features such as a field, trench and/or via. At 356, PVD-W is deposited on the features such as the field, trench and/or via. At 360, an etch process removes PVD-W. The etch is continued for a sufficient amount of time such that the PVD-W is removed from the side walls. At 362, selective CVD growth is initiated.

At 364, the method determines whether the desired thickness has been reached. If false, the method interrupts growth on the ILD at 366 and the method returns to 362. When the desired thickness is reached at 364, the method initiates nonselective CVD-W growth at 370. In some implementations, the nonselective CVD-W growth fills the via and trench regions and may extend above the field to allow subsequent processing. For example, the subsequent processing may include chemical mechanical polishing (CMP).

Referring now to FIGS. 11A-11C, deposition of tungsten in a via using another fill approach according to the present disclosure is shown. A substrate 400 includes a tungsten layer 404 and an interlayer dielectric (ILD) 402 defining a field 406, a trench 408, and/or a via 410. PVD-W 420 and 422 may be deposited on the field 406 using a non-directional physical vapor deposition (PVD) approach. Likewise, PVD-W 424 may be deposited on the trench 408 and PVD-W 426 may be deposited in the via 410. PVD-W 421, 423 and 425 may be deposited on sidewalls. An etchback process with selectivity in the field, sidewall and trench regions may be used to remove PVD-W at 420'-425'. For example, fluorine radicals or fluorine gas may be used.

CVD-W 434 is deposited on the via 426 approach. In other words, the tungsten is grown using one or more selective CVD-W growth and growth interruption steps. Then, non-selective CVD-W growth is initiated and may continue until the non-selective CVD-W extends above the field to allow subsequent processing. For example, the subsequent processing may include chemical mechanical polishing (CMP).

Figure 11D:
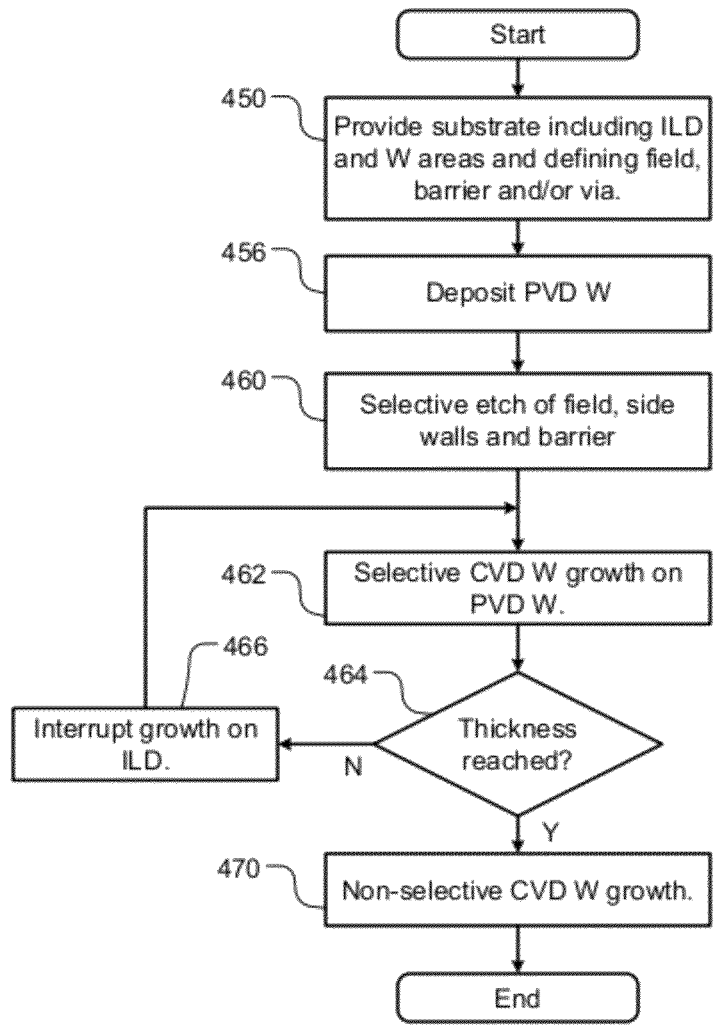
FIG. 11D is a flowchart illustrating a method for depositing tungsten in the via of FIGS. 11A-11C.

Referring now to FIG. 11D, a method for depositing tungsten in the via of FIGS. 11A-11C is shown. At 450, a substrate is provided that includes ILD and tungsten layers that define features such as vias, trenches and/or fields. At 456, PVD-W is deposited. At 460, a selective etch process removes PVD-W from the side walls, trench and field but not completely from the via 410 (at 426'). At 462, selective CVD growth is initiated.

At 464, the method determines whether the desired thickness has been reached. If false, the method interrupts growth on the ILD surfaces at 466 and the method returns to 462. When the desired thickness is reached at 464, the method initiates nonselective CVD-W growth at 470. In some implementations, the nonselective CVD-W growth fills the via and trench regions and may extend above the field to allow subsequent processing. For example, the subsequent processing may include chemical mechanical polishing (CMP).

The broad teachings of the disclosure can be implemented in a variety of forms. Therefore, while this disclosure includes particular examples, the true scope of the disclosure should not be so limited since other modifications will become apparent to the skilled practitioner upon a study of the drawings, the specification, and the following claims.

What is claimed is:

1. A method for processing a substrate, comprising:
    providing a substrate including a metal layer, a dielectric layer arranged on the metal layer, and at least one of a via and a trench formed in the dielectric layer;
    depositing metal using chemical vapor deposition (CVD) during a first deposition period, wherein the first deposition period is longer than a first nucleation delay period that is required to deposit the metal on the metal layer;
    stopping the first deposition period prior to a second nucleation delay period, wherein the second nucleation delay period is required to deposit the metal on the dielectric layer;
    performing a growth interruption treatment to interrupt growth of the metal on the dielectric layer, wherein the growth interruption treatment comprises one of:
        an ammonia soak during a soak period; or
        a fluorine soak during a soak period;
    performing the depositing and the stopping N times, where N is an integer greater than or equal to one; and
    after the performing, depositing the metal using CVD during a second deposition period that is longer than the second nucleation delay period.

2. The method of claim 1, wherein the metal comprises tungsten.

3. The method of claim 1, wherein the metal layer comprises tungsten.

4. The method of claim 1, further comprising depositing a nucleation layer prior to the first deposition period.

5. The method of claim 4, wherein the nucleation layer comprises one of fluorine-free tungsten layer and a tungsten/tungsten-nitride layer.

6. The method of claim 4, wherein the nucleation layer has a thickness between 2 Angstroms and 30 Angstroms.

7. The method of claim 1, wherein the growth interruption treatment comprises performing the ammonia soak during the soak period.

8. The method of claim 1, wherein the growth interruption treatment comprises performing the fluorine soak during the soak period.

9. The method of claim 4, further comprising performing a sputter etch process prior to the first deposition period to remove the nucleation layer in the via at a contact bottom to expose the metal layer.

10. A method for processing a substrate, comprising:
    providing a substrate including a metal layer, a dielectric layer arranged on the metal layer, and at least one of a via and a trench formed in the dielectric layer;
    during a first deposition period, depositing metal using physical vapor deposition (PVD);
    depositing the metal using chemical vapor deposition (CVD) during a second deposition period, wherein the second deposition period is longer than a first nucleation delay period required to deposit the metal on the metal layer;
    stopping the second deposition period prior to a second nucleation delay period, wherein the second nucleation delay period is required to deposit the metal on the dielectric layer;
    performing a growth interruption treatment to interrupt growth of the metal on the dielectric layer, wherein the growth interruption treatment comprises one of:
        an ammonia soak during a soak period; or
        a fluorine soak during a soak period;
    performing the CVD depositing and the stopping N times, where N is an integer greater than or equal to one; and
    after the performing, depositing the metal using CVD during a third deposition period that is longer than the second nucleation delay period.

11. The method of claim 10, wherein the metal comprises tungsten.

12. The method of claim 10, wherein the metal layer comprises tungsten.

13. The method of claim 10, wherein the growth interruption treatment comprises performing the ammonia soak for the soak period.

14. The method of claim 10, wherein the growth interruption treatment comprises performing the fluorine soak for the soak period.

15. The method of claim 10, wherein the PVD comprises directional PVD.

16. The method of claim 10, wherein the PVD comprises non-directional PVD.

17. A method for processing a substrate, comprising:
providing a substrate including a metal layer, a dielectric layer arranged on the metal layer, and at least one of a via and a trench formed in the dielectric layer;
during a first deposition period, depositing metal using physical vapor deposition (PVD);
depositing the metal using chemical vapor deposition (CVD) during a second deposition period, wherein the second deposition period is longer than a first nucleation delay period required to deposit the metal on the metal layer;
stopping the second deposition period prior to a second nucleation delay period, wherein the second nucleation delay period is required to deposit the metal on the dielectric layer;
performing the CVD depositing and the stopping N times, where N is an integer greater than or equal to one;
after the performing, depositing the metal using CVD during a third deposition period that is longer than the second nucleation delay period; and
performing a sputter etch process to etch the metal from sidewalls of the via prior to the second deposition period and third deposition period.

18. A method for processing a substrate, comprising:
providing a substrate including a metal layer, a dielectric layer arranged on the metal layer, and at least one of a via and a trench formed in the dielectric layer;
during a first deposition period, depositing metal using physical vapor deposition (PVD);
depositing the metal using chemical vapor deposition (CVD) during a second deposition period, wherein the second deposition period is longer than a first nucleation delay period required to deposit the metal on the metal layer;
stopping the second deposition period prior to a second nucleation delay period, wherein the second nucleation delay period is required to deposit the metal on the dielectric layer;
performing the CVD depositing and the stopping N times, where N is an integer greater than or equal to one;
after the performing, depositing the metal using CVD during a third deposition period that is longer than the second nucleation delay period; and
performing a sputter etch process to etch the metal from a field of the substrate, the trench and sidewalls of the via prior to the second deposition period and the third deposition period.

* * * * *